United States Patent
Hwang

(10) Patent No.: US 7,609,553 B2
(45) Date of Patent: Oct. 27, 2009

(54) NAND FLASH MEMORY DEVICE WITH BURST READ LATENCY FUNCTION

(75) Inventor: Sang-won Hwang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 120 days.

(21) Appl. No.: 11/511,275

(22) Filed: Aug. 29, 2006

(65) Prior Publication Data

US 2007/0058480 A1 Mar. 15, 2007

(30) Foreign Application Priority Data

Sep. 12, 2005 (KR) ...................... 10-2005-0084731

(51) Int. Cl.
- G11C 16/06 (2006.01)
- G11C 16/26 (2006.01)
- G11C 16/32 (2006.01)
- G11C 7/10 (2006.01)
- G11C 7/22 (2006.01)

(52) U.S. Cl. .............................. 365/185.17; 365/233.18; 365/233.17; 365/189.05; 365/239; 365/189.15

(58) Field of Classification Search ............ 365/185.17, 365/193, 233.18, 233.17, 189.05, 239, 236, 365/230.09, 221, 189.15; 711/103, 218
See application file for complete search history.

(56) References Cited

U.S. PATENT DOCUMENTS

2001/0015905 A1* 8/2001 Kim et al. ...................... 365/51

2003/0174543 A1* 9/2003 Nagai et al. ............ 365/189.05
2004/0042257 A1 3/2004 Lee et al.
2005/0182893 A1 8/2005 Suh

FOREIGN PATENT DOCUMENTS

| JP | 2004-095155 | 3/2004 |
|---|---|---|
| KR | 1020010004197 A | 1/2001 |
| KR | 2003-0014378 | 2/2003 |
| KR | 2003-0014380 | 2/2003 |
| KR | 1020040020171 A | 3/2004 |
| KR | 1020040103494 A | 12/2004 |
| KR | 10-2005-0062744 | 6/2005 |
| WO | 02/11148 A1 | 2/2002 |

* cited by examiner

Primary Examiner—J. H. Hur
(74) Attorney, Agent, or Firm—Volentine & Whitt, PLLC

(57) ABSTRACT

A NAND flash memory device may include an interface block which receives an external read enable signal to output an internal clock signal during a read operation. The NAND flash memory device may also include a buffer clock controlling circuit which operates in response to a data output enable signal and the internal clock signal. The NAND flash memory device may also include a buffer clock generating circuit which receives the internal clock signal and which generates first and second buffer clock signals according to a control output of the buffer clock control circuit. The NAND flash memory device may also include a data output buffer circuit which sequentially outputs read data in response to one of the first and second buffer clock signals, wherein the buffer clock controlling circuit controls the buffer clock generating circuit to generate the second buffer clock signal having a single pulse when the data output enable signal is activated.

30 Claims, 8 Drawing Sheets

NAND FLASH MEMORY DEVICE WITH BURST READ LATENCY FUNCTION

BACKGROUND OF THE INVENTION

1. Field of the Invention

The present invention relates generally to semiconductor memory devices and, more particularly, to a NAND flash memory device.

This application claims priority to Korean Patent Application No. 2005-84731, filed Sep. 12, 2005, the subject matter of which is hereby incorporated by reference in its entirety.

2. Description of Related Art

In order to read data from a memory device, read commands and addresses may be applied sequentially, and according to predetermined timing, to NAND flash memory devices. Once read commands and addresses are inputted, NAND flash memory devices may carry out a sensing operation during a fixed time. Data stored in memory cells of selected rows may be transferred to registers (referred to as a "page buffer circuit"). During the sensing operation, NAND flash memory devices may maintain a ready/busy signal R/nB in a low state. When all data is transferred from memory cells to registers, the ready/busy signal R/nB is transitioned from a low level to a high level. At this time, NAND flash memory devices may transport data stored in registers to data pads in response to a high-to-low transition of read enable signals nRE that may be provided from memory controllers. Memory controllers may take data from the data pads during a low-to-high transition of read enable signals nRE.

The above-mentioned NAND flash memory devices output data, and memory controllers take data, within one cycle of read enable signals nRE. This data output and take mode may be a major obstacle in reducing the cycle time of read enable signal nRE. In general, the operation speed of memory controllers (or hosts) is faster than that of NAND flash memory devices. Therefore the speed at which data may be read from a NAND flash memory device is limited by the speed of the NAND flash memory device. The performance of memory controllers, therefore, depends on that of NAND flash memory devices. Thus, as the performance of NAND flash memory devices is improved, there is a possibility that the performance of memory controllers can be also improved. The performance of NAND flash memory devices may be improved by shortening the time cycle of the read enable signal nRE. However, it may be very difficult to shorten the time cycle of the read enable signal nRE in NAND flash memory devices employing the data output and fetch mode. This will be described in detail hereinafter.

FIG. 1 represents a timing diagram of a conventional flash memory device. In FIG. 1, if ready/busy signal R/nB is transitioned from a low level to a high level, then memory controllers may provide a read enable signal nRE1 to NAND flash memory devices. NAND flash memory devices may also generate an internal clock signal INT_nRE1 that is synchronized with the read enable signal nRE1. The internal clock signal INT_nRE1 may be generated by buffering the read enable signal nRE1. Next, data stored in registers may be synchronized with the internal clock signal INT_nRE1 to be transported by a data transfer path (including a column gate circuit and a data output circuit.) Because the internal clock signal INT_nRE1 is generated by buffering the read enable signal nRE1, a delay time tD1 may exist between the read enable signal nRE1 and the internal clock signal INT_nRE1. Similarly, because data stored in registers is transferred through the data transfer path, it may be loaded on data pads after a delay time tD2 occurring in the data transfer path. That is, the data may be loaded on data pads after the internal clock signal INT_nRE1 is transitioned from a high level to a low level, and a predetermined time tD2 passed.

The read performance of NAND flash memory devices may be improved by reducing the delay times tD1 and tD2. However, the delay times tD1 and tD2 are generally fixed. Therefore, it may be difficult to reduce the delay times tD1 and tD2. One method for improving the read performance of NAND flash memory devices may be to reduce a time cycle of the read enable signal. As stated above, NAND flash memory devices output data, and memory controllers take data within one cycle. However, even if the time cycle of a read enable signal nRE2 is shortened, as shown in FIG. 1, the delay times tD1 and tD2 may not be varied.

The present disclosure is directed in overcoming one or more problems associated with the conventional flash memory device.

SUMMARY OF THE INVENTION

One aspect of the present disclosure includes a NAND flash memory device. The NAND flash memory device may include an interface block which receives an external read enable signal to output an internal clock signal during a read operation. The NAND flash memory device may also include a buffer clock controlling circuit which operates in response to a data output enable signal and the internal clock signal. The NAND flash memory device may also include a buffer clock generating circuit which receives the internal clock signal and which generates first and second buffer clock signals according to a control output of the buffer clock control circuit. The NAND flash memory device may also include a data output buffer circuit which sequentially outputs read data in response to one of the first and second buffer clock signals, wherein the buffer clock controlling circuit controls the buffer clock generating circuit to generate the second buffer clock signal having a single pulse when the data output enable signal is activated.

Another aspect of the disclosure includes a memory system. The memory system may comprise of a NAND flash memory device. The memory system may also comprise of a memory controller which outputs a read enable signal to the NAND flash memory device during a read operation and which takes data from the NAND flash memory device after a burst latency time passed.

Yet another aspect of the disclosure includes a NAND flash memory device. The NAND flash memory device may comprise of an interface block which receives an external read enable signal during a read operation to output an internal clock signal. The NAND flash memory device may also comprise of a buffer clock controlling circuit which activates a clock enable signal in response to a first high-to-low transition of the internal clock signal when a data output enable signal is activated. The NAND flash memory device may also comprise of a first clock generator which generates a first buffer clock signal in response to the clock enable signal and a lock flag signal which indicates whether a first clock signal has zero phase difference with respect to the internal clock signal. The NAND flash memory device may also comprise of a second clock generator which generates a second buffer clock signal in response to the data output enable signal, the internal clock signal, and the lock flag signal. The NAND flash memory device may also comprise of a selection circuit which selects one of the first buffer clock signal and the second buffer clock signal according to a control output of the buffer clock controlling circuit. The NAND flash memory device may also comprise of a data output buffer circuit which sequentially outputs read data in response to the buffer clock signal selected by the selection circuit, wherein the second buffer clock generating circuit generates the second buffer clock signal having a single pulse when the data output enable signal is activated, and wherein the first buffer clock generating circuit generates the first buffer clock signal having zero phase difference with respect to the internal clock signal after the external read enable signal is inputted, and a burst read latency time has passed.

BRIEF DESCRIPTION OF THE DRAWINGS

Exemplary embodiments of the invention will be described in detail with reference to the attached drawings in which like reference symbols indicate the same or similar components. In the drawings.

DETAILED DESCRIPTION OF EXEMPLARY EMBODIMENTS

Figure 2:
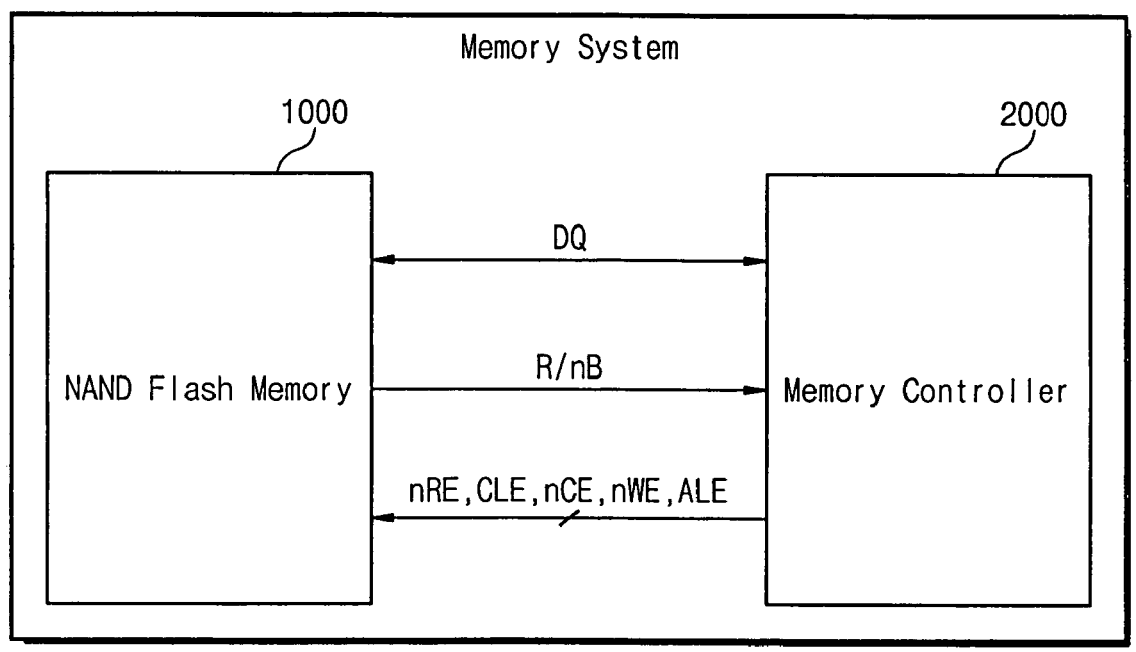
FIG. 2 is a block diagram illustrating a memory system having a NAND flash memory device according to an exemplary disclosed embodiment.

FIG. 2 is a block diagram showing a memory system having a NAND flash memory device according to an exemplary disclosed embodiment. Referring to FIG. 2, the memory system includes a NAND flash memory device 1000 and a memory controller 2000. The NAND flash memory device 1000 may communicate with the memory controller 2000, for example, in command/address/data multiplexed I/O manner. In an exemplary embodiment, the NAND flash memory device 1000 may activate a ready/busy signal (R/nB) to a low state for a predetermined time, e.g., a read time, when a command/address is inputted during a read operation. After the read time, the NAND flash memory device 1000 may activate the ready/busy signal (R/nB) to a high state. The memory controller 2000 may provide a read enable signal nRE to the memory device 1000 in response to a low-to-high transition of the ready/busy signal (R/nB). After the read enable signal nRE is provided to the memory device 1000, and a predetermined time (e.g., a time corresponding to a burst read latency time/n-cycle of nRE (where, n is 2 or an integral number greater than 2) has passed, the memory controller 2000 may take data from the memory device 1000. Hereinafter, this function may be referred to as a "Burst Read Latency (BRL)" function. Even if the period of the read enable signal nRE is shortened, depending on the BRL function, the NAND flash memory device 1000 outputs data, and the memory controller 2000 takes data within one cycle of the read enable signal nRE.

Figure 3:
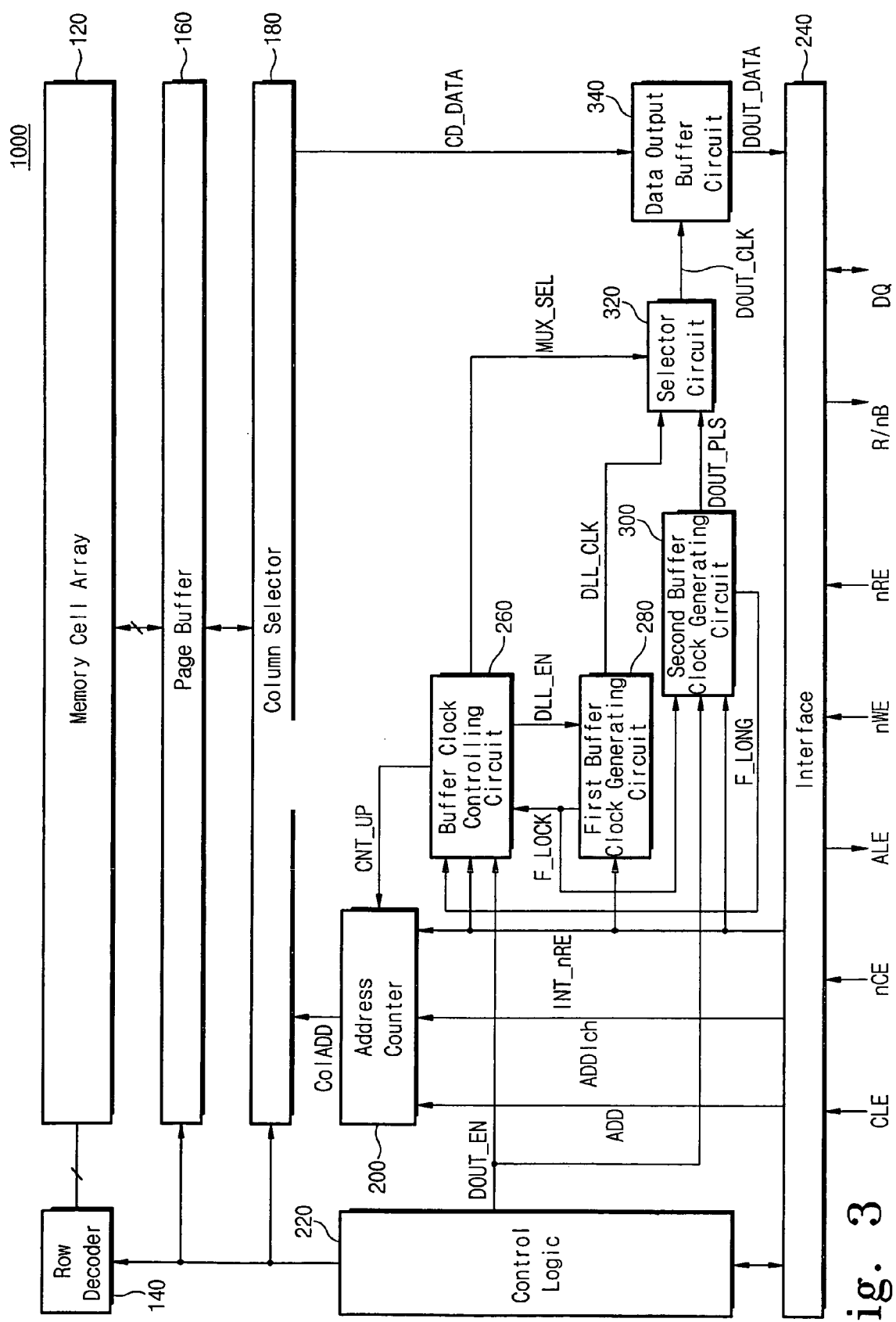
FIG. 3 is a block diagram illustrating the NAND flash memory device shown in FIG. 2 according to an exemplary disclosed embodiment.

FIG. 3 is a block diagram showing the NAND flash memory device of FIG. 2 according to an exemplary disclosed embodiment. Referring to FIG. 3, the NAND flash memory device 1000 includes a memory cell array 120 for storing data information, row decoder 140, page buffer 160, column selector 180, address counter 200, and control logic 220. The memory cell array 120 may include memory cells arranged in rows and columns. For example, the memory cells may be arranged to have a NAND string structure. In addition, the memory cells may be arranged in any other suitable format. Rows of the memory cell array 120 may be driven by the row decoder 140, and columns of the memory cell array 120 may be driven by the page buffer 160. The page buffer 160 may include page buffers which are operated as a sense amplifier and a write driver based on the mode of operation on the NAND flash memory device 1000. The column selection circuit 180 may select page buffers by a determined unit such as x8, x16, x32, and so forth, in response to an address Col1ADD from the address counter 200. The row decoder circuit 140, the page buffer circuit 160, and the column selection circuit 180 may be controlled by a control logic circuit 220.

The control logic circuit 220 may be operated in response to control signals and a command which may be supplied by an interface block 240. Furthermore, the control logic circuit 220 may be configured to control a whole operation of the NAND flash memory device. Specifically, if a command and an address are inputted during a read operation, the control logic circuit 220 controls an interface block 240 to activate the ready/busy signal (R/nB) in a low state. In particular, the interface block 240 includes a register (not shown) for storing the ready/busy signal (R/nB). A register value of the interface block 240 may be set by the control logic circuit 220. The control logic circuit 220 generates a control signal DOUT_EN as a data output enable signal during a read operation. Specifically, the control logic circuit 220 activates the control signal DOUT_EN after the page data is moved from the memory cell array 120 to the page buffer circuit 160 (i.e., after a sensing operation is ended, or a read time passed). After the page data is moved from the memory cell array 120 to the page buffer circuit 160, the control logic circuit 220 controls the interface block 240 (or register) so as to activate the ready/busy signal (R/nB) to a high state.

The interface block 240 generates a latch signal ADD1$ch$ when an external address is inputted, and the address counter 200 latches an address ADD provided by the interface block 240 in response to the latch signal ADD1$ch$. Furthermore, the interface block 240 outputs an internal clock signal INT_nRE that is synchronized with the read enable signal nRE provided from an external device, e.g., a memory controller. The address counter 200 is controlled by a count-up control signal CNT_UP and sequentially increases the address that is latched in response to the internal clock signal INT_nRE. For instance, when the count-up control signal CNT_UP is activated, the address counter 200 sequentially increases the address that is latched in response to the internal clock signal INT_nRE.

In an exemplary embodiment, the NAND flash memory device 1000 further includes a buffer clock controlling circuit 260, first and second buffer clock generating circuits 280 and 300, a selection circuit 320, and a data output buffer circuit 340. The buffer clock controlling circuit 260 may generate a clock enable signal DLL_EN in response to a data output enable signal DOUT_EN and the internal clock signal INT_nRE. For example, after the data output enable signal DOUT_EN is activated, the buffer clock controlling circuit 260 activates the clock enable signal DLL_EN during a first high-to-low transition of the internal clock signal INT_nRE. Furthermore, the buffer clock controlling circuit 260 may activate the count-up controlling signal CNT_UP in the first high-to-low transition of the internal clock signal INT_nRE after the clock enable signal DLL_EN is activated. When the count-up control signal CNT_UP is activated, the address counter 200 sequentially increases an address inputted in response to the internal clock signal INT_nRE. In addition, the buffer clock generating circuit 260 activates a selection signal MUX_SEL when a lock flag signal F_LCOK outputted from the first clock generating circuit 280 is activated.

The first clock generating circuit 280 generates the first buffer clock signal DLL_CLK in response to the clock enable signal DLL_EN from the buffer clock controlling circuit 260. The first buffer clock generating circuit 280 may be formed by a delay synchronization loop circuit and may generate the first buffer clock signal DLL_CK synchronized with the internal clock signal INT_nRE. That is, the first buffer clock generating circuit 280 generates the first buffer clock signal DLL_CLK having zero phase difference with respect to the internal clock signal INT_nRE. In addition, the first buffer clock generating circuit 280 activates the lock flag signal F_LOCK if there is no phase difference between the first buffer clock signal DLL_CLK and the internal clock signal INT_nRE.

The second buffer clock generating circuit 300 generates the second buffer clock signal DOUT_PLS and the flag signal F_LONG in response to the data output enable signal DOUT_EN, the lock flag signal F_LOCK, and the internal clock signal INT_nRE. For example, when the data output enable signal DOUT_EN is activated, the second buffer clock generating circuit 300 outputs the second buffer clock signal DOUT_PLS having single pulse. If the lock flag signal F_LOCK is not activated when that the data output enable signal DOUT_EN is activated and a predetermined time has passed, the second buffer clock generating circuit 300 activates the flag signal F_LONG and outputs the internal clock signal INT_nRE as the second buffer clock signal DOUT_PLS. The buffer clock controlling circuit 260 deactivates the clock enable signal DLL_EN when the flag signal F-LONG is activated. Thus, the first clock generating circuit 280 is not operated. If the lock flag signal F_LOCK and the data output enable signal DOUT_EN are activated, and a predetermined time has passed, the flag signal F_LONG is maintained in a deactivated state.

Figure 1:
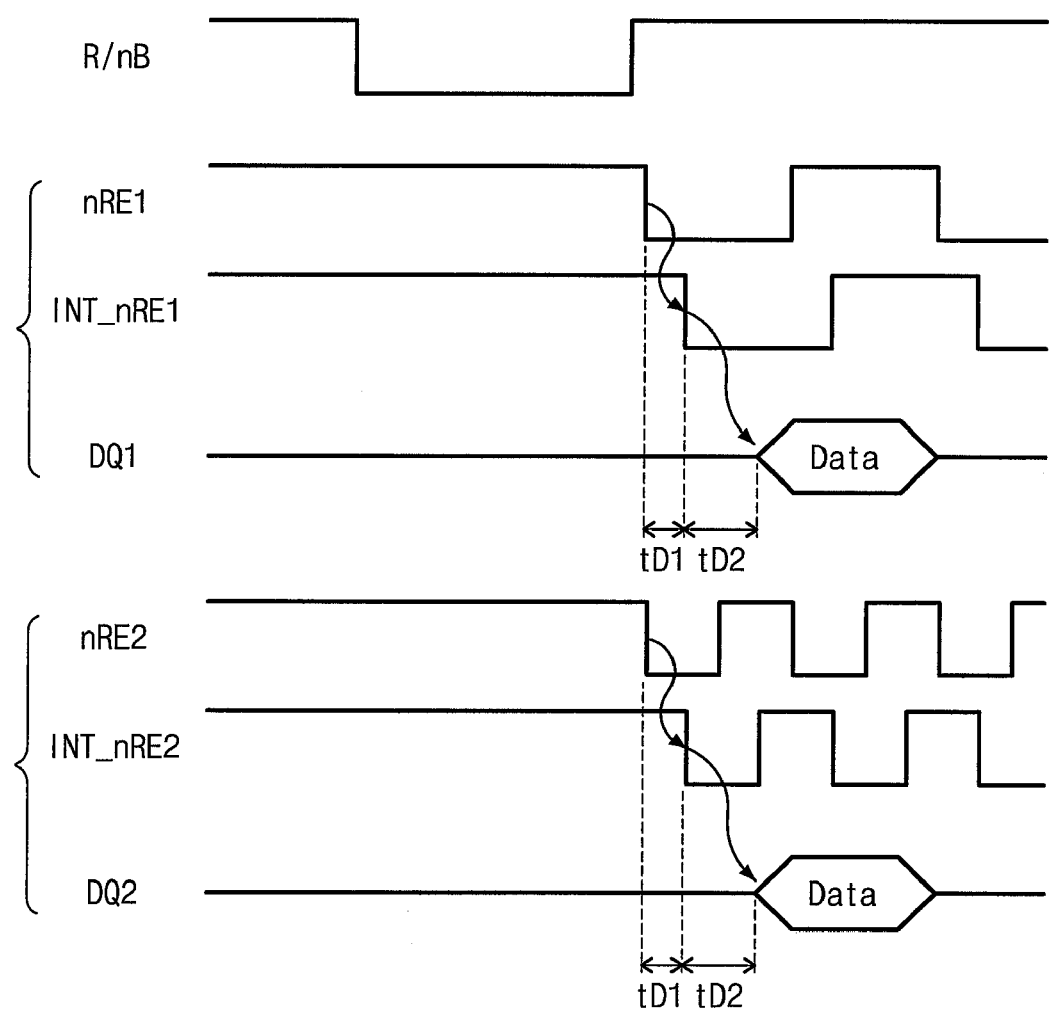
FIG. 1 is a timing diagram illustrating a data output timing of a conventional NAND flash memory device.

In an exemplary embodiment, the flag signal F_LONG indicates whether the read enable signal nRE has a long cycle or a short cycle. These cycles may be defined as follows: when the memory controller operation for taking data depends on the above-mentioned delay times tD1 and tD2 (See FIG. 1), the cycle of the read enable signal nRE is defined as a short cycle; and when the memory controller operation for taking data does not depend on the above-mentioned delay times tD1 and tD2 (See FIG. 1), the cycle of the read enable signal nRE is defined as a long cycle.

The selector circuit 320 outputs one of outputs DLL_CLK and DOUT_PLS of the first and second buffer clock generating circuits 280 and 300 to the data output buffer 340 in response to a selection signal MUX_SEL. The selection signal MUX_SEL is maintained in an inactive state before the lock flag signal F_LOCK is activated and is activated when the lock flag signal F_LOCK is activated. The selection circuit 320 selects the output DOUT_PLS of the second buffer clock generating circuit 300 when the selection signal MUX_SEL is maintained in an inactive state and selects the output DLL_CLK of the first buffer clock generating circuit 280 when the selection signal MUX_SEL is activated. The data output buffer circuit 340 is synchronized with the clock signal DOUT_CLK from the selection circuit 320 to transfer data CD_DATA from the column selection circuit 180 to the interface block 240.

It may be possible to remove a delay time of the internal clock signal by generating a buffer clock signal having zero phase difference with respect to the internal clock signal from the first buffer clock generating circuit 280. Therefore, a time required to transfer data to the data pad may be shortened. Accordingly, it may be possible to shorten a cycle time of the read enable signal nRE. As a result, a read function may be improved in the NAND flash memory device 1000 and the memory system including it.

Figure 4:
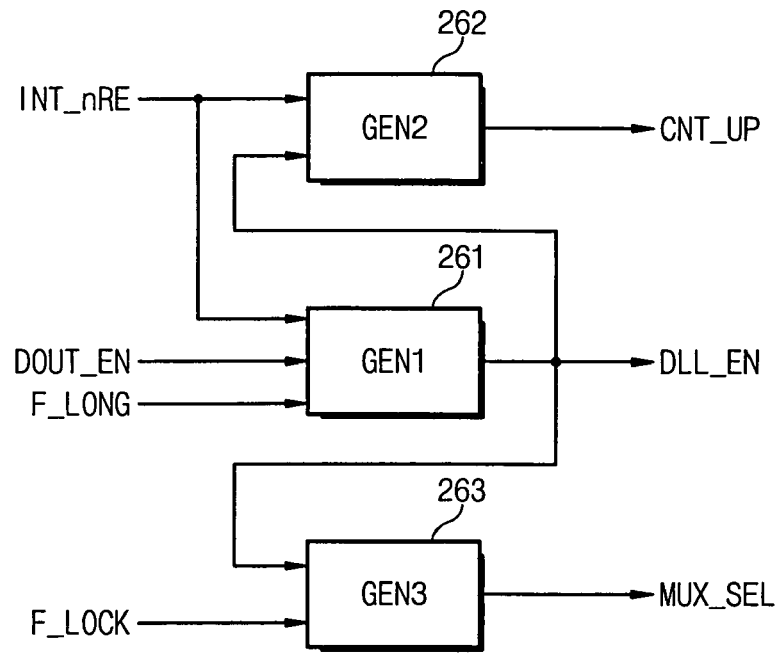
FIG. 4 is a block diagram illustrating a buffer clock controlling circuit shown in FIG. 3 according to an exemplary disclosed embodiment.

FIG. 4 is a block diagram showing the buffer clock controlling circuit 260 of FIG. 3. Referring to FIG. 4, the buffer clock controlling circuit 260 includes first to third signal generators 261, 262, and 263, labeled as GEN1, GEN2, and GEN3, respectively. The first signal generator 261 generates the clock enable signal DLL_EN in response to the internal clock signal INT_nRE, the data output enable signal DOUT_EN, and a flag signal F_LONG. For example, after the output enable signal DOUT_EN is activated in a high state, the first signal generator 261 activates the clock enable signal DLL_EN in response to a first high-to-low transition of the data output enable signal DOUT_EN. The first signal generator 261 also activates the clock enable signal DLL_EN when the flag signal F_LONG is activated. The second signal generator 262 generates a count-up control signal CNT_UP in response to the clock enable signal DLL_EN and the internal clock signal INT_nRE. For example, the second signal generator 262 activates the count-up control signal CNT_UP in a high state in response to a high-to-low transition of the internal clock signal INT_nRE when the clock enable signal is activated. The third signal generator 263 generates the selection signal MUX_SEL in response to the clock enable signal DLL_EN and the lock flag signal F_LOCK. For example, while the clock enable signal DLL_EN is activated, the third signal generator 263 activates the selection signal MUX_SEL in response to the lock flag signal F_LOCK.

Figure 5:
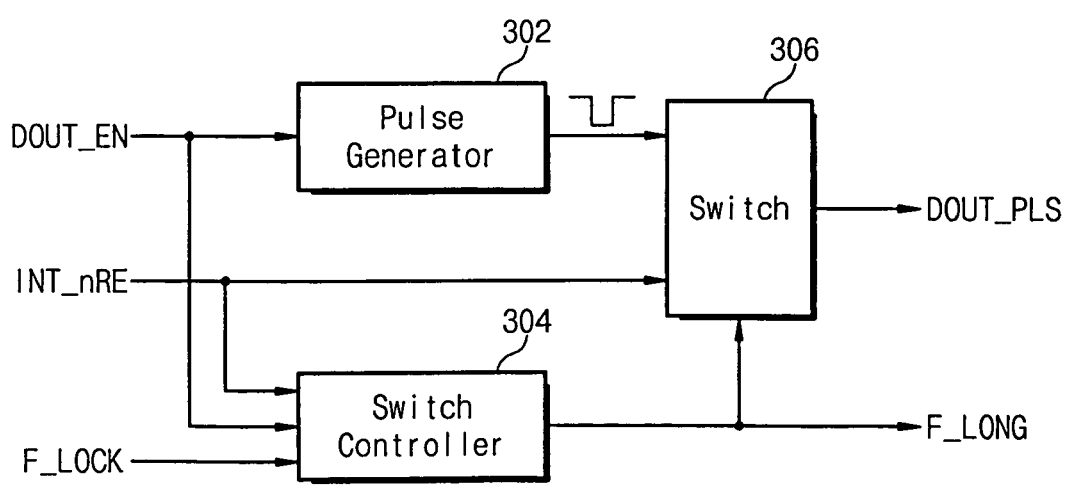
FIG. 5 is a block diagram illustrating a second buffer clock generating circuit shown in FIG. 3 according to an exemplary disclosed embodiment.

FIG. 5 is a block diagram showing the second clock generating circuit 300 of FIG. 3. Referring to FIG. 5, the second clock generating circuit 300 of an exemplary embodiment includes a pulse generator 302, a switch controller 304, and a switch 306.

The pulse generator 302 generates an active-low pulse signal in response to activation (e.g., a low-to-high transition) of the data output enable signal DOUT_EN. The switch controller 304 generates the selection signal F_LONG in response to the data output enable signal DOUT_EN, the internal clock signal INT_nRE, and the lock flag signal F_LOCK. Specifically, after the data output enable signal DOUT_EN is activated, and a predetermined time (e.g., a burst read latency time of a memory device) has passed, the switch controller 304 activates the selection signal F_LONG as a flag signal based on the state of the lock flag signal F_LOCK. For example, after the data output enable signal DOUT_EN is activated, and a predetermined time (e.g., a burst read latency time of a memory device) has passed, the selection signal F_LONG is activated in a high state when the lock flag signal F_LOCK is maintained in an inactive state, i.e., a low level. This may mean that a cycle of the read enable signal nRE is long. In contrast, after the data output enable signal DOUT_EN is activated, and a predetermined time (e.g., a burst read latency time of a memory device) has passed, the selection signal F_LONG is maintained in an inactive state of a low level when the lock flag signal F_LOCK is activated in a low state. This may mean that a cycle of the read enable signal nRE is short. In this case, the selection signal F_LONG is used as a flag signal which is applied to the buffer clock controlling circuit 260 of FIG. 3.

The switch 306 may be configured to receive as inputs an output of the pulse generator 302 and the internal clock signal INT_nRE. The switch 306 may also be configured to output the second buffer clock signal DOUT_PLS in response to the selection signal F_LONG. For example, when the selection signal F_LONG is maintained in an active state, the switch 306 outputs the internal clock signal INT_nRE as the second buffer clock signal DOUT_PLS.

Figure 6:
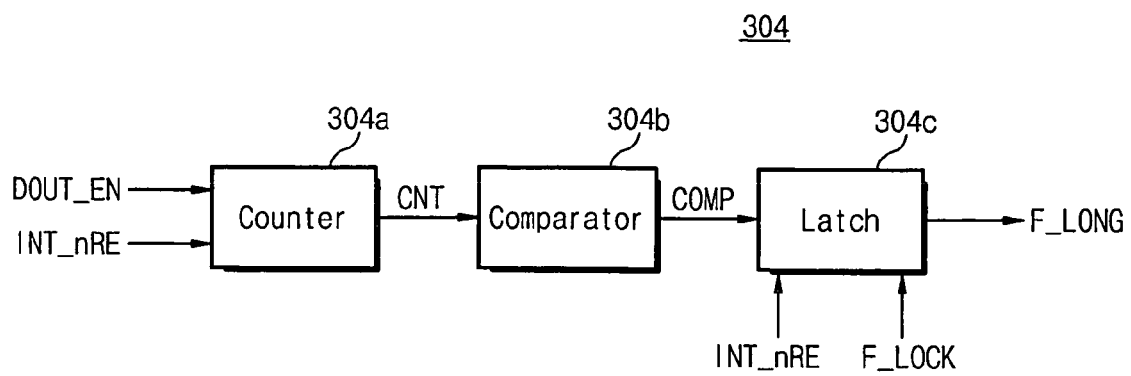
FIG. 6 is a block diagram illustrating a switch controller shown in FIG. 5 according to an exemplary disclosed embodiment.

FIG. 6 is a block diagram of the switch controller 304 of FIG. 5. Referring to FIG. 6, in an exemplary embodiment, the switch controller 304 includes a counter 304a, a comparator 304b, and a latch 304c.

The counter 304a may be operated in response to activation (e.g., a low-to-high transition) of the data output enable signal DOUT_EN and may perform a count operation based on the internal clock signal INT_nRE. The comparator 304b may compare an output CNT of the counter 304a with a reference value to generate a comparison signal COMP. For example, when the output CNT of the counter 304a is smaller than the reference value, the comparison signal COMP is maintained in an inactive state, i.e., a low level. On the other hand, when the output CNT of the counter 304a reaches the reference value, the comparison signal COMP is activated in a high state. In an exemplary embodiment, the reference value of the comparator 304b may be controlled by a burst read latency value.

The latch 304c latches the lock flag signal F_LOCK during low-to-high transition of the internal clock signal INT_nRE when the comparison signal COMP is set to a high state and outputs the flag signal F_LONG as a selection signal. When the lock flag signal F_LOCK has a high level, the flag signal F_LONG is maintained at a low level. When the latched lock flag signal F_LOCK has a low level, the flag signal F_LONG is activated in a high level.

Figure 7:
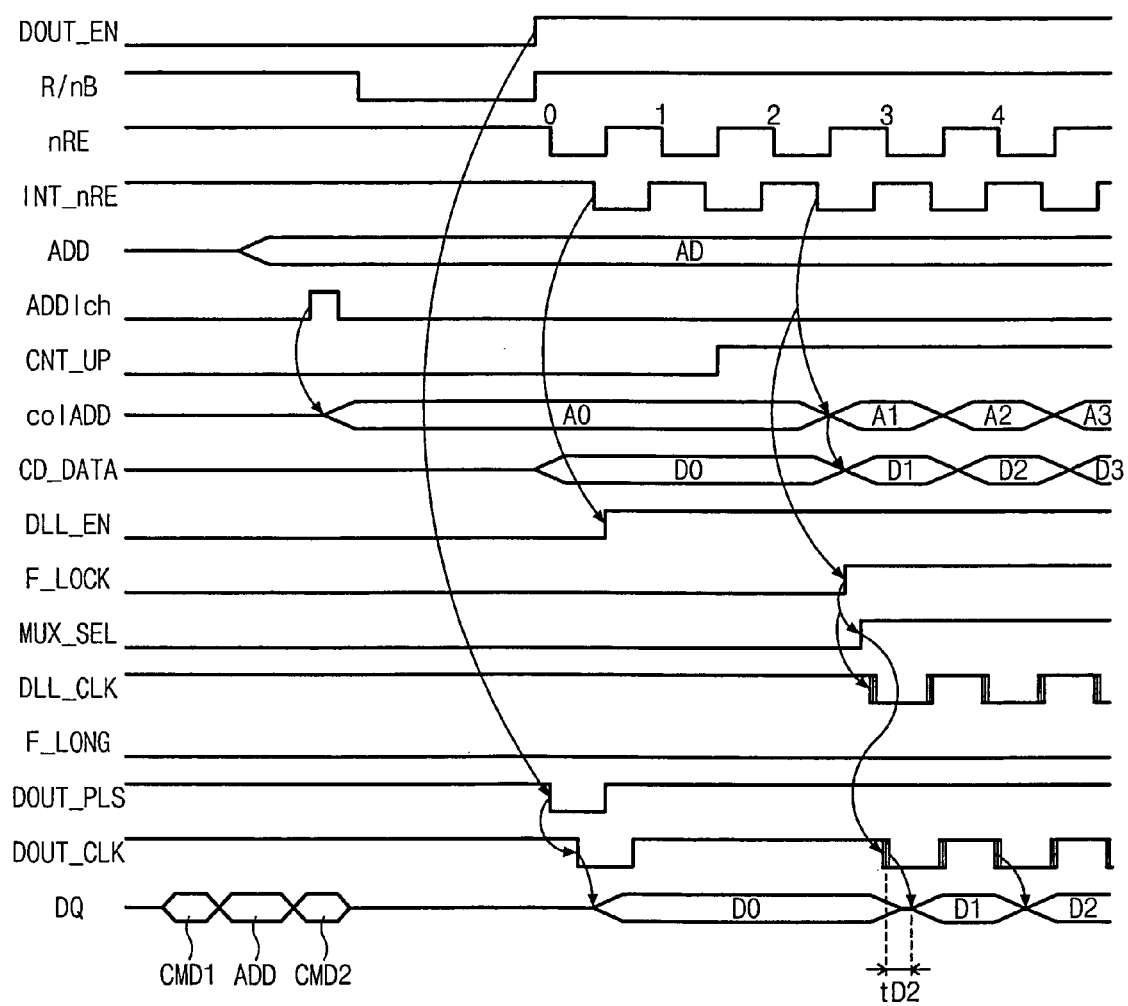
FIG. 7 is a timing diagram illustrating a read operation of the NAND flash memory device according to an exemplary disclosed embodiment.

FIG. 7 is a timing diagram illustrating a read operation of the flash memory device according to an exemplary disclosed embodiment. The read operation of the NAND flash memory device, as shown in FIG. 7, is sequentially performed when a first command CMD1, an address ADD, and a second command CMD2 are sequentially inputted based on a predetermined timing. When the address ADD is inputted, the interface block 240 generates a latch signal ADDIch. The address counter 200 latches the address ADD from the interface block 240 in response to the latch signal ADDIch. The latched address is applied to an initial column address A0 and the column selection circuit 180. When the second command CMD2 is inputted, the control logic circuit 240 controls the interface block 240 so as to activate the ready busy signal R/nB to a low level. While the ready busy signal R/nB is maintained in a low level, data at any row/page is read by the page buffer circuit 160 according to a control signal of the control logic circuit 220. That is, a sensing operation is performed by the page buffer circuit 160. Once the sensing operation is performed completely, the control logic circuit 220 activates the data output enable signal DOUT_EN to a high state. At the same time, the control logic circuit 220 controls the interface block 240 so as to inactivate the ready/busy signal R/nB.

As the data output enable signal DOUT_EN is activated to a high state, the column selection circuit 180 selects a part of the page buffers of the page buffer circuit 160 in response to the initial column address A0. The selected page buffers are transported to the data output buffer circuit 340. At the same time, the second buffer clock generating circuit 320 generates the second buffer clock signal DOUT_PLS of the active low pulse in response to the activation of the data output enable signal DOUT_EN. At this time, because the flag signal F_LONG is maintained in an inactivation state of a low level, the second buffer clock signal DOUT_PLS is supplied through the selection circuit 320 to the data output buffer circuit 340. The data output buffer circuit 340 is synchronized with the second buffer clock signal DOUT_PLS to output data DO from the column selection circuit 180 to the data pads DQ by the interface block 240.

As the ready/busy signal R/nB is activated to a high state, the memory controller 2000 outputs the read enable signal nRE as an external clock signal to the NAND flash memory device 1000. In an exemplary embodiment, the memory controller 2000 takes data loaded on the data pads after a predetermined burst read latency time passed.

The interface block 240 generates the internal clock signal INT_nRE in response to the read enable signal nRE. When the data output enable signal DOUT_EN is activated, the buffer clock controlling circuit 260 activates the clock enable signal DLL_EN to a high state in response to a first high-to-low transition of the internal clock controlling circuit 260. The first buffer clock generating circuit 280 is operated in response to the clock enable signal DLL_EN. As stated above, the first buffer clock generating circuit 280 consists of delay synchronization loop circuits. The delay synchronization loop circuit may generate a buffer clock signal having zero phase difference with respect to an input clock within one cycle after the clock enable signal DLL_EN. One skilled in the art will appreciate that a delay synchronization loop circuit requiring 2 or more than 2 cycles may be used to generate a clock signal having zero phase difference with respect to an input clock. In an exemplary embodiment, the lock flag signal F_LOCK may be delayed by a time equal to the number of cycles required by the delay synchronization loop circuit.

As shown in FIG. 7, after the clock enable signal DLL_EN is activated, the buffer clock controlling circuit 260 activates the count-up signal CNT_UP to a high state in response to high-to-low transition (the second cycle) of the internal clock signal INT_nRE. Once the count-up signal CNT_UP is activated, the address counter 200 sequentially generates column address (A1, A2, . . . , and so forth) every time the internal clock signal INT_nRE is transitioned from a high level to a low level. The column addresses are provided in a manner such that the page buffers of the page buffer circuit 160 are sequentially selected by a predetermined unit.

The first clock generating circuit 280 detects whether a buffer clock signal having zero phase difference with respect to an input clock after the clock enable signal DLL_EN is activated, is generated during a high-to-low transition (the third cycle) of the internal clock signal INT_nRE. In the event that such a signal is generated, the first clock generating circuit 280 activates the lock flag signal F_LOCK to a high state. When the lock flag signal F_LOCK is activated, the buffer clock controlling circuit 260 activates the selection signal MUX_SEL to a high state. This may allow an output of the first clock generating circuit to be transported to the data output buffer circuit 340 through the selection circuit 320. With an activation of the lock flag signal F_LOCK as shown in FIG. 7, the flag signal F_LONG is continuously maintained in an inactivation state of a low level.

The data output buffer circuit 340 may be synchronized with the clock signal DOUT_CLK (i.e., the first buffer clock signal) outputted by the selector circuit 320 to sequentially output the rest of data (D1, D2, . . . , and so forth) except the first data D0 to the data pads. Furthermore, the memory controller 2000 may take data loaded on the data pads during every low-to-high transition of the read enable signal nRE after a burst read latency time (e.g., 2-cycle time of nRE) has passed.

As shown in FIG. 7, after the read enable signal nRE is transitioned from a high level to a low level, and a predetermined time tD2 has passed, data is loaded on the data pads. Therefore, because a delay time of the internal clock signal INT_nRE is removed, it may be possible to reduce a cycle time of the read enable signal nRE. Accordingly, the read function of the NAND flash memory device of the present invention and the memory system including the same may be improved.

Figure 8:
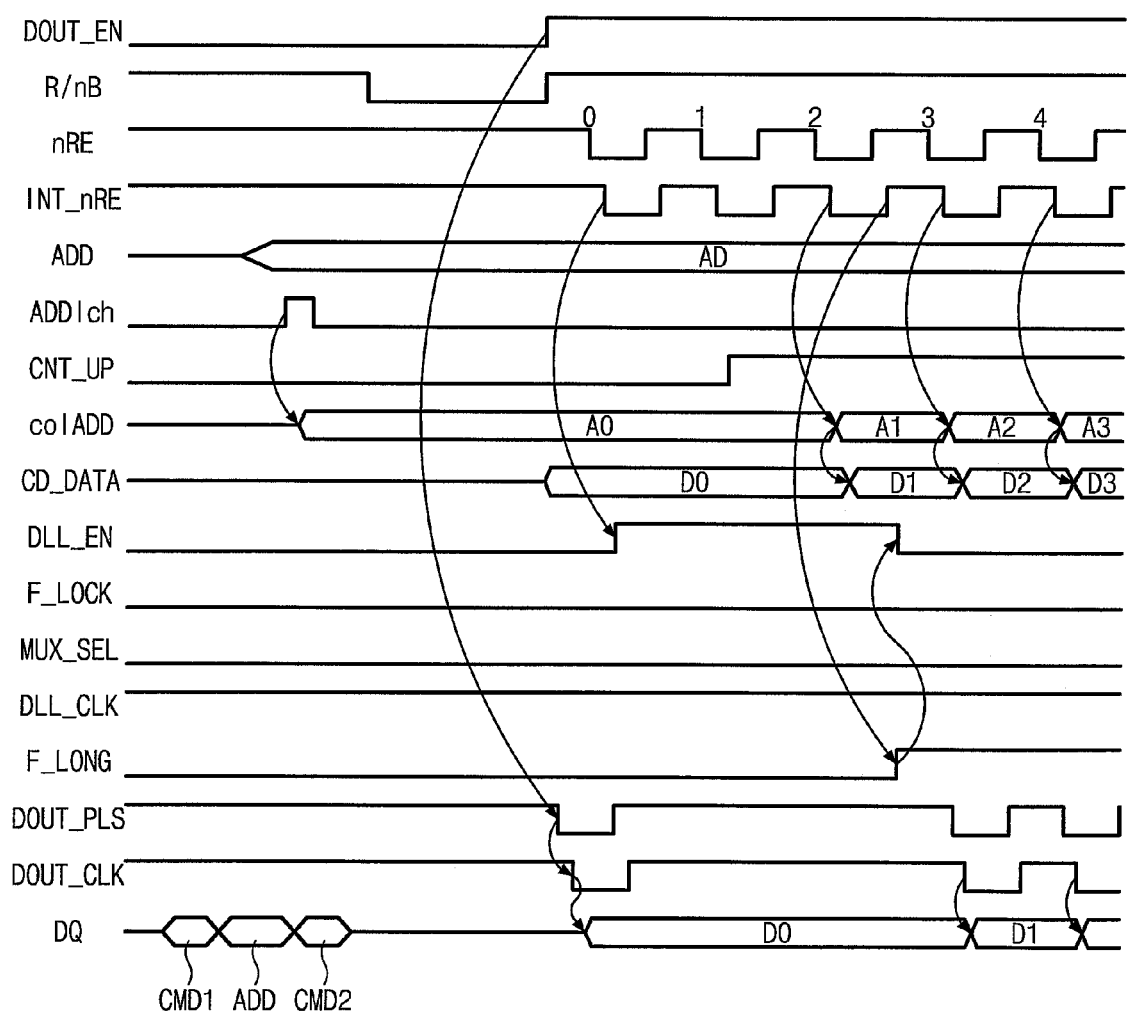
FIG. 8 is a timing diagram illustrating a read operation of the NAND flash memory device according to an alternative exemplary disclosed embodiment.

FIG. 8 is a timing diagram illustrating a read operation of the flash memory device according to an alternative exemplary disclosed embodiment. The read operation of FIG. 8 is the same as that of FIG. 7, except for the differences mentioned below.

As shown in FIG. 8, if the lock flag signal F_LOCK is not activated at the predetermined point (e.g., the third high-to-low transition point of the internal clock signal INT_nRE), when the clock enable signal DLL_EN is activated, the switch controller 304 of the second clock generating circuit 300 activates the flag signal F_LONG as a selection signal to a high state. This may allow the internal clock signal INT_nRE to be selected by the switch 306. At the same time, because the lock flag signal F_LOCK is not activated, the selection signal MUX_SEL is continuously maintained in an inactive state of a low level. Therefore, the buffer clock signal DOUT_PLS outputted from the second clock generating circuit 300 is applied to the data output buffer circuit 340 by the selection circuit 320. The buffer clock controlling circuit 260 deactivates the clock enable signal DLL_EN in response to an activation of the lock flag signal F_LOCK. This may allow the first buffer clock circuit 280 to be deactivated, so that undesired power consumption can be reduced.

Figure 9:
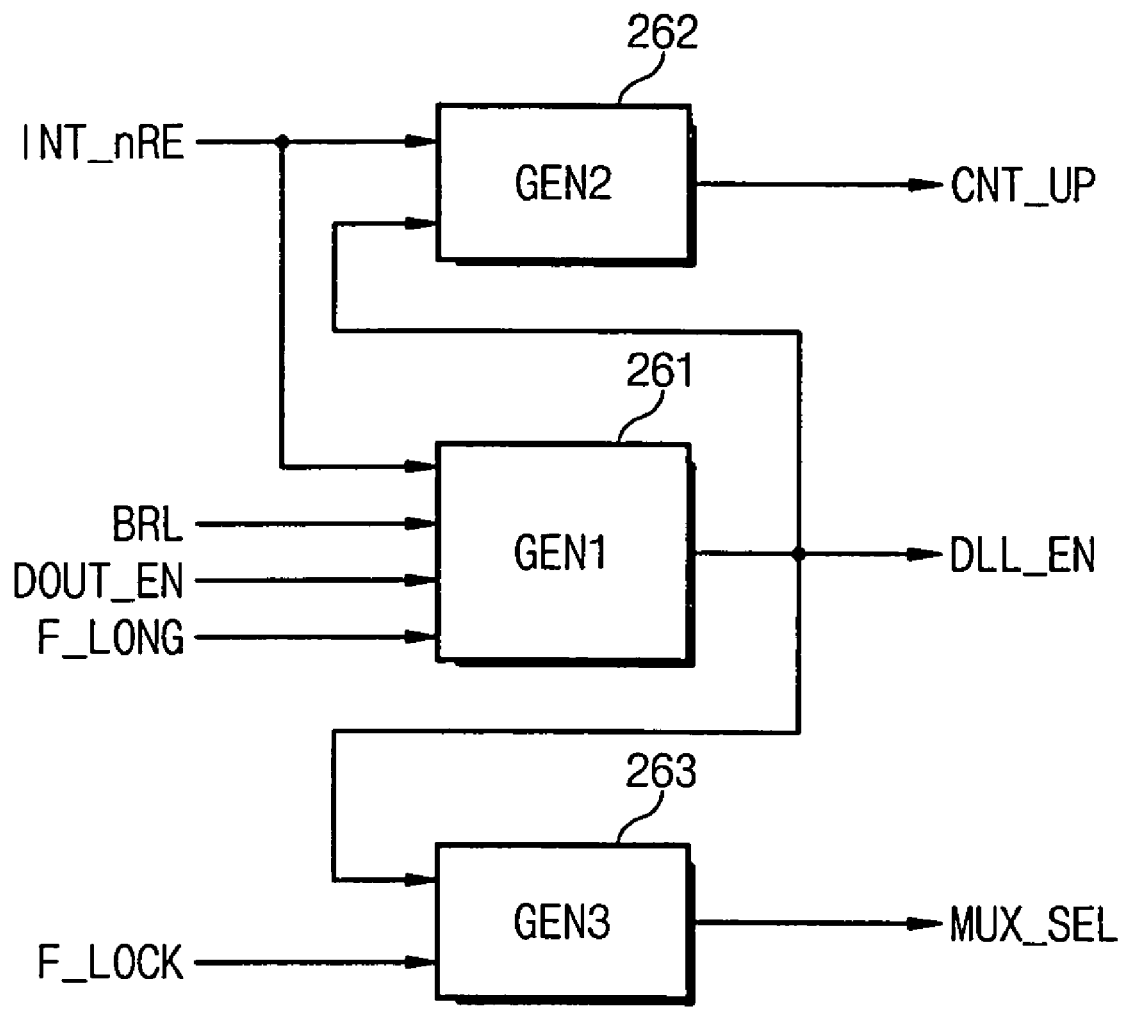
FIG. 9 is a block diagram illustrating the buffer clock controlling circuit shown in FIG. 3 according to an alternative exemplary disclosed embodiment.

The burst read latency time of the NAND flash memory device in the present disclosure may be variable. Specifically, the burst read latency time may be varied by controlling an activation point of the clock enable signal DLL_EN. For example, as shown in FIG. 9, a first signal generator 261 of the buffer clock controlling circuit 260 may be configured to determine the activation point of the clock enable signal DLL_EN according to a burst read latency value BRL. Specifically, the first signal generator 261 of the buffer clock controlling circuit 260 activates the clock enable signal DLL_EN during a high-to-low transition of the internal clock signal INT_nRE in the i-numbered cycle (where, i is the BRL value having an integral value of $\geq 1$) depending on the burst read latency value BRL provided from an external source when the data output enable signal DOUT_EN is activated.

As described above, the memory controller 2000 may take data from the NAND flash memory device 1000 of the present disclosure after the burst read latency time has passed. However, after the burst read latency time has passed, the delay time tD1 may be removed in every cycle of the read enable signal nRE. The burst read latency time may therefore be negligibly shorter than the sum of delay time tD1 and the number of cycles that are required to take data. Therefore, it may be possible for the memory controller 2000 to reduce the time needed for taking page data.

As described above, it may be possible to reduce a cycle time of the read enable signal nRE by removing the delay time tD1 of the internal clock signal INT_nRE. Accordingly, the read operation of the NAND flash memory device and the memory system including the same may be improved.

The invention has been described using exemplary embodiments; however, it will be understood that the scope of the invention is not limited to only the disclosed embodiments. Rather, the scope of the invention is intended to encompass various modifications and similar arrangements. The scope of the claims, therefore, should be accorded the broadest interpretation so as to encompass all such modifications and similar arrangements.

What is claimed is:

1. A NAND flash memory device comprising:
   an interface block which receives an external read enable signal to output an internal clock signal during a read operation;
   a buffer clock controlling circuit which operates in response to a data output enable signal and the internal clock signal;
   a buffer clock generating circuit which receives the internal clock signal and which generates first and second buffer clock signals according to a control output of the buffer clock control circuit; and
   a data output buffer circuit which sequentially outputs read data in response to one of the first and second buffer clock signals,
   wherein the buffer clock controlling circuit controls the buffer clock generating circuit to generate the second buffer clock signal having a single pulse when the data output enable signal is activated.

2. The NAND flash memory device of claim 1, wherein the data output buffer circuit is synchronized with the second buffer clock signal to output data to a data pad.

3. The NAND flash memory device of claim 1, wherein when the first buffer clock signal having zero phase difference with respect to the internal clock signal is generated, the buffer clock controlling circuit controls the buffer clock generating circuit to transfer the internal clock signal to the data output buffer circuit.

4. The NAND flash memory device of claim 1, wherein when the first buffer clock signal having zero phase difference with respect to the internal clock signal is not generated, the buffer clock controlling circuit controls the buffer clock generating circuit so that the internal clock signal as the second buffer clock signal is transferred to the data output buffer circuit.

5. The NAND flash memory device of claim 1, wherein the buffer clock generating circuit activates a clock enable signal in response to a first high-to-low transition of the internal clock signal.

6. The NAND flash memory device of claim 5, wherein the buffer clock generating circuit comprises:
   a first clock generator which generates the first buffer clock signal in response to the clock enable signal and generates a lock flag signal indicating whether a first buffer clock signal having zero phase difference with respect to the internal clock signal is generated;
   a second clock generator which generates the second buffer clock signal in response to the data output enable signal, the internal clock signal, and a lock flag signal; and
   a selector which transfers one of the first buffer clock signal and the second buffer clock signal according to a control output of the buffer clock controlling circuit.

7. The NAND flash memory device of claim 6, wherein the buffer clock controlling circuit controls the selector to transfer the second buffer clock signal with a single pulse to the data output buffer circuit before the lock flag signal is generated.

8. The NAND flash memory device of claim 6, wherein the buffer clock controlling circuit controls the selector to transfer the first buffer clock signal to the data output buffer circuit when the lock flag signal is generated.

9. The NAND flash memory device of claim 6, wherein the buffer clock controlling circuit controls the data output buffer circuit to transfer the internal clock signal as the second buffer clock signal to the data output buffer circuit after the lock flag signal is not generated and a burst read latency time passed.

10. The NAND flash memory device of claim 6, wherein when the lock flag signal is not generated, the buffer clock controlling circuit deactivates the clock enable signal to deactivate the first buffer clock generator.

11. The NAND flash memory device of claim 6, wherein the burst read latency time is varied by changing an activation time of the clock enable signal.

12. The NAND flash memory device of claim 6, wherein the first clock generating circuit includes a delay synchronization loop circuit.

13. The NAND flash memory device of claim 6, wherein the buffer clock controlling circuit generates a count-up controlling signal in response to the first high-to-low transition of the internal clock signal after the clock enable signal is activated.

14. The NAND flash memory device of claim 13, further comprising an address counter which receives an external address during a read operation to sequentially generate one or more internal addresses,
wherein the address counter is synchronized with the internal clock signal to sequentially generate the one or more internal addresses when the count-up controlling signal is activated.

15. The NAND flash memory device of claim 14, further comprising:
a page buffer circuit which reads page data from a memory cell array; and
a column selection circuit which selects the page data of the page buffer circuit by a predetermined unit in response to an internal address outputted from the address counter and outputs the selected data as read data to the data output buffer circuit.

16. A memory system comprising a NAND flash memory device, and a memory controller which outputs a read enable signal to the NAND flash memory device during a read operation and which takes data from the NAND flash memory device after a burst latency time passed, wherein the NAND flash memory device comprises:
an interface block which receives the read enable signal to output an internal clock signal;
a buffer clock controlling circuit which operates in response a data output enable signal and the internal clock signal;
a buffer clock generating circuit which receives the internal clock signal and which generates first and second buffer clock signals according to a control output of the buffer clock controlling circuit; and
a data output buffer circuit which sequentially outputs read data in response to one of the first and second buffer clock signals.

17. The memory system of claim 16, wherein the buffer clock controlling circuit controls the buffer clock generating circuit to generate the second buffer clock signal with a single pulse when the data output enable signal is activated, and
wherein the buffer clock controlling circuit controls the buffer clock generating circuit to generate the first buffer clock signal having zero phase difference with respect to the internal clock signal after the read enable signal is inputted and a burst read latency time has passed.

18. The memory system of claim 17, wherein the data output buffer circuit is synchronized with the second buffer clock signal to output data to a data pad.

19. The memory system of claim 17, wherein when the first buffer clock signal having zero phase difference with respect to the internal clock signal is generated, the buffer clock controlling circuit controls the buffer clock generating circuit to transfer the first buffer clock signal to the data output buffer circuit.

20. The memory system of claim 17, wherein when the first buffer clock signal having zero phase difference with respect to the internal clock signal is not generated, the buffer clock controlling circuit controls the buffer clock generating circuit to transfer the internal clock signal as the second buffer clock signal to the data output buffer circuit.

21. A NAND flash memory device comprising:
an interface block which receives an external read enable signal during a read operation to output an internal clock signal;
a buffer clock controlling circuit which activates a clock enable signal in response to a first high-to-low transition of the internal clock signal when a data output enable signal is activated;
a first clock generator which generates a first buffer clock signal in response to the clock enable signal and a lock flag signal which indicates whether a first clock signal has zero phase difference with respect to the internal clock signal;
a second clock generator which generates a second buffer clock signal in response to the data output enable signal, the internal clock signal, and the lock flag signal;
a selection circuit which selects one of the first buffer clock signal and the second buffer clock signal according to a control output of the buffer clock controlling circuit; and
a data output buffer circuit which sequentially outputs read data in response to the buffer clock signal selected by the selection circuit,
wherein the second buffer clock generating circuit generates the second buffer clock signal having a single pulse when the data output enable signal is activated, and
wherein the first buffer clock generating circuit generates the first buffer clock signal having zero phase difference with respect to the internal clock signal after the external read enable signal is inputted, and a burst read latency time has passed.

22. The NAND flash memory device of claim 21, wherein the buffer clock controlling circuit controls the selection circuit to transfer the second buffer clock signal having a single pulse to the data output buffer circuit before the lock flag signal is generated.

23. The NAND flash memory device of claim 21, wherein the buffer clock controlling circuit controls the selection circuit to transfer the first buffer clock signal to the data output buffer circuit when the lock flag signal is generated.

24. The NAND flash memory device of claim 21, wherein the buffer clock controlling circuit controls the selection circuit to transfer the internal clock signal as the second buffer clock signal to the data output buffer circuit after the burst latency time passed and the lock flag signal is not generated.

25. The NAND flash memory device of claim 21, wherein the buffer clock controlling circuit deactivates the clock enable signal to deactivate the first buffer clock generator when the lock flag signal is not generated.

26. The NAND flash memory device of claim 21, wherein the burst read latency time is varied by changing an activation time of the clock enable signal.

27. The NAND flash memory device of claim 21, wherein the first buffer clock generating circuit includes a delay synchronization loop circuit.

28. The NAND flash memory device of claim 21, wherein the buffer clock controlling circuit generates a count-up controlling signal in response to the first high-to-low transition of the internal clock signal after the clock enable signal is activated.

29. The NAND flash memory device of claim 28, further comprising an address counter which receives an external address during the read operation to sequentially generate one or more internal addresses, wherein the address counter is synchronized with the internal clock signal to sequentially generate the one or more internal addresses when the count-up controlling signal is activated.

30. The NAND flash memory device of claim 29, further comprising:
   a page buffer circuit which reads from a memory cell array; and
   a column selection circuit which selects the page data of the page buffer circuit by a predetermined unit in response to an internal address outputted from the address counter and outputs the selected data as read data to the data output buffer circuit.

* * * * *